United States Patent [19]
Flohrs et al.

[11] 3,942,244
[45] Mar. 9, 1976

[54] SEMICONDUCTOR ELEMENT

[75] Inventors: Peter Flohrs, Altenfurt; Horst Schäfer, Wendelstein, both of Germany

[73] Assignee: Semikron Gesellschaft fur Gleichrichterbau und Elektronik m.b.H., Nuremburg, Germany

[22] Filed: May 24, 1974

[21] Appl. No.: 473,228

Related U.S. Application Data

[60] Division of Ser. No. 125,351, March 17, 1971, abandoned, which is a continuation of Ser. No. 778,735, Nov. 25, 1968, abandoned.

[30] Foreign Application Priority Data
Nov. 24, 1967 Germany............................ 1614658

[52] U.S. Cl. .................... 29/590; 148/185; 357/71
[51] Int. Cl.²........................................... B01J 17/00
[58] Field of Search .......... 29/590; 148/185; 357/71

[56] References Cited
UNITED STATES PATENTS

| 3,436,615 | 4/1969 | Finlayson | 357/71 |
| 3,492,546 | 1/1970 | Rosvold | 357/71 |
| 3,523,222 | 8/1970 | Jaeger | 357/71 |
| 3,562,040 | 2/1971 | Garies | 357/71 |

*Primary Examiner*—W. Tupman
*Attorney, Agent, or Firm*—Spencer & Kaye

[57] ABSTRACT

A semiconductor electrode is prepared by (a) contacting a semiconductor with a first contacting metal (capable of forming an alloy with the semiconductor), (b) contacting the first contacting metal with a ductile layer of a second contacting metal, (c) heating the resulting combination so as to form, simultaneously, a liquid phase between the semiconductor and the first contacting metal and between the first contacting metal and the ductile second contacting metal, however leaving intact a major portion of the ductile second contacting metal layer, and (d) cooling the thus obtained product whereby a solder contact which is resistant to load fluctuations can be readily made on the ductile layer with known semiconductor hard solder.

12 Claims, 4 Drawing Figures

INVENTORS
Peter Flohrs &
Horst Schäfer
BY *Spencer & Kaye*
ATTORNEYS

SEMICONDUCTOR ELEMENT

CROSS-REFERENCE TO RELATED APPLICATION

This application is a division of copending application Ser. No. 125,351, filed Mar. 17, 1971, now abandoned, which itself is a continuation of Ser. No. 778,735, filed Nov. 25, 1968, now abandoned.

BACKGROUND OF THE INVENTION

In various branches of the art, semiconductor devices, particularly semiconductor rectifiers of high current load-carrying capability, are more and more often used under extreme operating conditions due to their state of development. An extraordinarily heavy stress is placed on large-area semiconductor rectifiers, particularly when used with frequent changes between no load and nominal load. Changes in operating temperature with corresponding changes in load (due to the varying physical characteristics of the different materials employed) result in subjecting the layer construction of the semiconductor device to heavy tangential or shearing forces. These forces act primarily on the semiconductor wafer and on solder contact layers disposed between the semiconductor wafer and adjacent current-conductive components and often lead to malfunction of the semiconductor device after only a short period of operation. The effect of these stresses is dependent on the frequency of load changes and the thus occurring changes in operating temperatures as well as on the range of these differences in operating temperature.

In order to provide desired variable-load-resistant contacts between a semiconductor wafer and current-conductive components by means of a suitable semiconductor solder, it is advisable, particularly for technical production reasons, to provide the semiconductor wafer with metallic contact coatings of high mechanical stability before they are contacted.

There are thus semiconductor devices in which the semiconductor wafer is bonded to a contact plate by an alloying or soldering process, at least at one contacting surface. The contact plate preferably consists of a material, e.g. molybdenum and tungsten, which has a coefficient of thermal expansion approximately corresponding to the coefficient of thermal expansion of the semiconductor material.

Moreover, there are semiconductor devices having a semiconductor wafer provided with at least one metallic contact coating which is particularly suited to permit planar contact by means of soft solder.

In other semiconductor devices a contact coating (serving exclusively to improve wetting by a special semiconductor solder provided for the contact) is applied to the semiconductor wafer. This solder, which has high mechanical stability and a melting point below 450°C, remains resilient even under the influence of varying mechanical stresses and will hereafter be referred to as a semiconductor hard solder.

Known semiconductor devices, however, do not seem to be suited for use with extreme load variations due to (a) insufficient compensation of mechanical stresses resulting from different coefficients of thermal expansion, (b) lack of mechanical stability and resiliency of the soft solders employed or (c) undesirable transfer of tangential or shearing forces from resilient semiconductor hard solder to the semiconductor wafer.

There are also semiconductor devices in which a semiconductor wafer, which is firmly connected to a molybdenum or tungsten wafer, is contacted by means of current-conductive components under pressure from spring members. In spite of good compensation for variations in thermal expansion provided by the construction of these known arrangements, this so-called pressure-contacting does not seem to be the best solution of the contacting problem in semiconductor devices, particularly in view of the requirement that thermal contact resistance be as low as possible.

German Published patent application Ser. No. 1,074,160 discloses a method for producing virtually blockage-free contact electrodes on semiconductor bodies in which, in order to achieve soft solder contacts for the application of leads, predetermined surface regions of the semiconductor body are provided with a first metal layer with an work function which approximates that of the semiconductor material. Onto this first metal a second metal is applied for the solder-attachment of leads with the requirement that, during the soldering process, an alloying take place only at the border area between the solder and the second metal, not at border areas between the second metal and the first metal or between the first metal and the semiconductor material. This problem particularly pertains to the provision of a blockage-free contact on small-area semiconductor devices, preferably to the base contacting of transistors.

SUMMARY OF THE INVENTION

An object of this invention is to apply a contact electrode on a large-area semiconductor wafer.

Another object is to make the contact electrode resistant to varying loads and otherwise in compliance with the high requirements placed on soldered contacts.

A further object is to provide a contact electrode which can satisfy these standards in conjunction with a semiconductor hard solder.

Still further objects will be apparent from the ensuing description.

The present invention relates to a method for the production of a large-area contact electrode for semiconductor devices of high current load capability in which a semiconductor wafer is provided with a metal layer construction in order to achieve a soldering contact which is resistant to load fluctuations) which serves as a contact electrode.

The semiconductor devices realized by the present invention do not exhibit the above-mentioned drawbacks of known embodiments. The contact electrode has an additional advantage in that it absorbs and particularly compensates transverse mechanical stresses in adjacent contact materials and assures a surprisingly high resistance to varying loads, even under extreme operating conditions.

The method according to the present invention pertains to a large-area contact electrode (with an area of at least 0.05 sq. inch) for an ohmic or a rectifying contact on the semiconductor body of a semiconductor rectifier of high current load capability which is also optimally resistant to load fluctuations and in which the contacting is accomplished with current-conductive components via a ductile metallic layer by means of a semiconductor hard solder.

The method according to the invention is distinguished by the facts (a) that the semiconductor surface to be contacted is provided with a predetermined thickness of a first contacting metal which is capable of forming an alloy with the semiconductor material, (b) that a second contacting metal which forms a ductile layer is applied thereonto, (c) that through subsequent heat treatment in a predetermined temperature range a liquid phase is formed at the border area between the second contacting metal forming the ductile layer and the first contacting metal and, simultaneously, at the border area between the first contacting metal and the semiconductor material, (d) that a desired good ohmic or rectifying contact is thus formed with the semiconductor material which has a given doping and (e) that the major portion of the second contacting metal, which forms the ductile layer, remains intact in its structure as a ductile contacting layer even during and after the heat treatment, making possible, in connection with a known semiconductor hard solder, a solder contact on the semiconductor wafer which is resistant to load fluctuations.

Large-area contact electrode means a contact area of at least 0.05 sq. inch. This corresponds approximately to a semiconductor rectifier of 30 Amps max. direct current.

DESCRIPTION OF THE PREFERRED EMBODIMENTS

Figure 1:
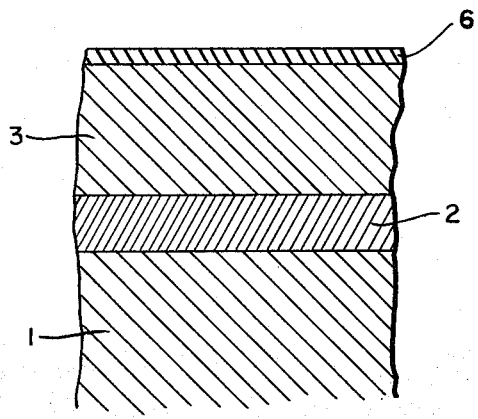
FIGS. 1 and 2 are cross sections of semiconductor electrodes before and after heat treatment, respectively.

The basic material for the semiconductor device to be produced is a wafer of semiconductive material, preferably silicon, which is provided according to known methods, with layers of alternatingly opposite conductivity types. With reference to FIG. 1 of the drawings, the prepared, large-area semiconductor wafer 1 is covered in a vacuum apparatus of appropriately arranged evaporators and at a pressure of approximately $10^{-5}$ Torr with a first contacting metal 2, for example aluminum, and thereafter with a second contacting metal 3, for example silver, the quantity of the contacting metals being determined by the predetermined layer thicknesses and the area to be covered. In order to realize better adhesion of the first contacting metal on the semiconductor material, the semiconductor wafer is heated before the vapor-deposition process to a suitable temperature, preferably from 200° to 300°C. Following the vapor-deposition the semiconductor wafer, which is now covered with two contacting layers, 2 and 3, is subjected to a heat treatment whereby liquid phases are formed essentially simultaneously at least at the border area between the semiconductor material and the first contacting metal and at the border area between the first contacting metal and the second contacting metal which forms the ductile layer. Recrystallization of the liquid phases is effected without ever reaching the eutectic temperature of the second contacting metal-semiconductor material combination, since this would cause the two materials to form a brittle layer and thus the essential feature of the process according to the present invention, i.e. the production of a ductile contacting layer for further contacting, would not be present. (During the heat treatment the entire layer 2 may be dissipated between the alloy formed with the semiconductor and that which permeates into the ductile metal.) These requirements result in an advantageous temperature range of, preferably, from 600° to 700°C for the heat treatment of the preferred contacting metal combination of aluminum and silver (aluminum eutectically alloys with silicon at 577° C; silver with aluminum at 566°C; however silver with silicon at 830°C).

Figure 3:
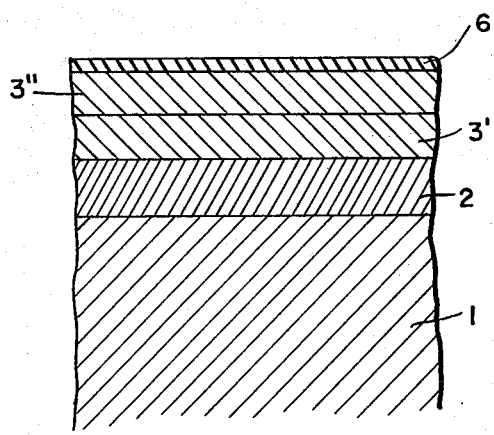
FIG. 3 shows in its cross-section a contact electrode of a semiconductor rectifier according to the present invention whereby the ductile second contacting metal consists of two successive layers.

With the arrangement of contacting metal layers as per FIG. 3, the first layer 3' of both layers 3' and 3'' of the second contacting metal is advantageously obtained by vapor-deposition under high vacuum, as already described for the production of an electrode as per FIG. 1. On layer 3' the second layer 3'' of the second contacting metal is precipitated, e.g., electroless or galvanically. Suitable baths for such processes are known.

The first layer 3' may have a thickness of 1 to $10\mu$, the second layer 3'' should have a thickness of at least $2\mu$. The total thickness for both layers is practically unlimited upwards.

After applying all contacting metal layers 2, 3' and 3'', a heat treatment follows forming a ternary system between semiconducting material, first contacting metal 2 and first layer 3' of the second contacting metal.

Figure 4:
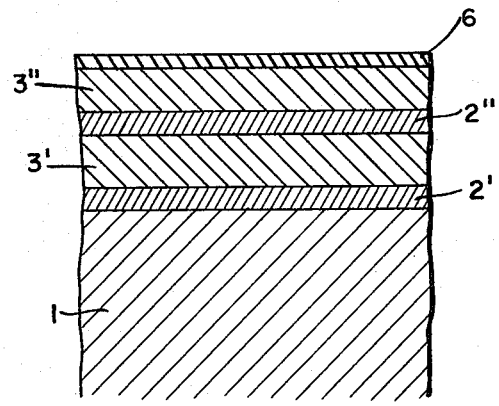
FIG. 4 shows also in its cross-section a contact electrode of a semiconductor rectifier whereby the first and second contacting metals are arranged each in two alternating layers.

In the type of contact electrode as illustrated in FIG. 4, two layers 3' and 3'' of the second contacting metal have been applied to two alternatiing layers 2' and 2'' of the first contacting metal. Through the subsequent heat treatment again a ternary system is formed by means of layers 1,2' and 3', whereas liquid phases and binary systems at the border area between the layers 3' and 2'', as well as between layers 2'' and 3'' are formed. The thickness of the layers is to be proportioned such as to preserve, especially of the two layers 3' and 3'' of the ductile second contacting metal, a part which does not participate in the formation of an alloy and thus still possesses the desired good mechanical characteristics after the heat treatment.

The first contacting metal 2 must also form a good mechanical contact when alloying with the semiconductor material 1. Aluminum, for example, forms a good ohmic contact when alloyed with p-doped silicon or with heavily n-doped silicon; with weakly n-doped silicon, however, it forms a rectifying contact.

The heat treatment can occur in vacuo or under a protective gas atmosphere and is accomplished in such a manner that the layer-covered semiconductor wafers are heated to the predetermined temperature and are subsequently rapidly cooled. If the alloying formation is effected by heat treatment in vacuum, such vacuum should have at least $10^{-2}$ torr for a second contacting metal layer of precious metal and more than $10^{-3}$ torr for a layer of copper. If, however, the forming of an alloy is effected in a protective-gas atmosphere, only non/oxidizing gases can be used. Nitrogen, a gas-mixture consisting of nitrogen and hydrogen, a so-called forming gas or rare gas are preferred.

The heat treatment can be effected in such a manner that the parts for the alloying are put in the cold furnace, that the heating zone is evacuated or flowed through by protective gas, that the furnace is continuously heated up to a temperature of 600°– 700°C, and that the furnace is switched to as soon as the parts of be treated have achieved this temperature thence to cool normally. The cooling process is not critical.

The thickness of each of the two contacting metal layers is determined, on the one hand, by the requirement for good areal alloying between consecutive materials and, on the other hand, by the physical laws applicable for the formation of an alloy between these materials. For reasons of economy both contacting metal layers should be as thin as possible. The requirement for the first contacting metal is a mechanically stable fusion with the semiconductor material as well as with the second contacting material. On the other hand, during the formation of an alloy 4 between the first contacting metal 2 and the semiconductor material 1 the predetermined conductivity type of the outer layer of the semiconductor material must not be changed nor must this layer be alloyed in such a manner as to destroy the pn-junction adjacent the external semiconductor layer toward the interior of the semiconductor wafer. Accordingly, a layer thickness for the first contacting metal which is in the range of from 0.1 to 3 microns ($\mu$) is advantageous.

The undesired change of the conductivity type or the destruction of the pn-junction or junctions at shallow depths or shallow n-diffused junctions can be avoided in that the contacting metal of aluminium or magnesium first used is not too thick compared with the depth of impurity penetration (preferably 10–20%).

The thickness of the second contacting metal which forms a ductile layer depends on the solubility of the first contacting metal in the second contacting metal and thus, depending on the contacting metals used, on the layer thickness of the first contacting metal, on the costs of the second contacting metal, the processing technique and the time required therefor. A layer thickness of at least $3\mu$ for the second contacting metal, with a corresponding thickness of the first contacting metal, is sufficient for the realization of semiconductor devices according to the present invention.

With the preferred contacting metals of aluminum and silver, advantageous results are achieved with a layer thickness of from 1 to $2\mu$ for the aluminum and from 5 to $15\mu$ for the silver.

The thickness of the first contacting metal is furthermore determined by the conductivity type and the impurity concentration of the adjacent layer of the semiconductor body. A layer-thickness of at least $0.1\mu$ is still sufficient for the layer construction according to the invention and more than $3\mu$ are not necessary. The layer-thickness of the first contacting metal is preferably $1 - 2\mu$.

For the first contacting metal only metals can be used which form together with the semiconducting material and the second contacting metal an eutectic alloy having a melting point sufficiently below the eutectic temperature of the system semiconducting material - second contacting metal. Furthermore only metals can be considered as favourable which do not form brittle phases with the semiconducting material. Especially aluminum and magnesium are suitable for the first contacting metal if silicon is used as semiconducting material.

The lowest limit for the thickness of the second contacting metal is determined by the solubility of the first contacting metal in the second contacting metal and the formation of a ternary system between semiconducting material and both contacting metals, as well as by the solder used for the connection with current conduction elements and the soldering temperature.

If, e.g., $2\mu$ aluminum and $10\mu$ silver are applied to a semiconductor body, approximately $1.8\mu$ aluminum and $1.6\mu$ silicon with approximately $2\mu$ silver are dissolved to a three-component compound silicon-aluminum-silver and approximately $1\mu$ silver is dissolved in solder, so that 70% silver remain as a ductile layer. According to the thickness of the first contacting metal the second contacting metal layer should have at least $3\mu$. There is practically no upper limit, since as with the increasing thickness of the second contacting metal the capability for withstanding thermal cycling of the semiconductor components also rises.

With silicon as semiconductor material and aluminum and magnesium as first contacting metal, silver, palladium and copper may be used as metals for the second contacting layer.

For semiconducting material for the production of components with high current load capability, only substances or compounds which have an adequate distance between the conduction band and the valence band in the energy band diagram, e.g. silicon, germanium, gallium arsenide, silicon carbonate, are suitable silicon is preferred.

Figure 2:
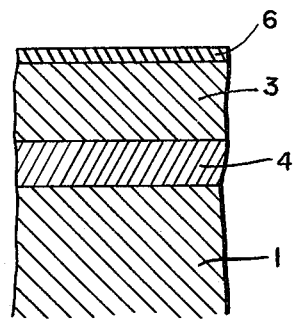

From the heat treatment for the formation of an alloy between the contacting metals, as well as between the semiconductor material and the first contacting metal results a recrystallization layer as per FIG. 2 containing the whole first contacting metal 2 and the adjacent surface layers of the semiconductor body 1 and the second contacting metal 3. This layer shows a thickness corresponding to the share of its components and may be much thicker than the original first contacting metal layer 2. Its thickness depends especially on the thickness of the layer 2 as well as on the alloying temperature and the alloying time. The largest part of layer 3 of the second contacting metal, not participating in the alloy, shows the desired mechanical features, particularly the required ductility, also after the process as described in this invention.

In addition to the above-mentioned contacting metals it is also possible to use, e.g., palladium or copper as the second contacting metal and magnesium as the first contacting metal. The ductility of copper, however, is less than that of silver; however, the use of copper provides an economic advantage, which is not even outweighed by the fact that the surface of the copper layer (which tends to oxidize and which is not suited for wetting semiconductor solders without a fluxing agent) must be covered with a thin layer 6 of a precious metal, for example gold or silver. When layer 3 is a layer of precious metal, layer 6 can be eliminated or layer 3 and layer 6 can be considered as one and the same ductile layer.

An advantageous further development is that the second contact layer, which forms the ductile layer, is applied in several layers in order to obtain the required ductility and to increase mechanical stability, or several layers of both contacting metals are applied in alternating succession.

The contacting metals can alternatively be applied to cathode sputtering and/or by precipitation. To produce thicker layers, the materials may be first vapor-deposited and then suitably precipitated.

According to the present invention, an application of a sequence of layers of contacting materials, which are specially suited for a fusion with each other and for fusion with the semiconductor material, and a subsequent heat treatment result in the formation of a contact electrode (formed on semiconductor material by alloying) as well as a metallic contacting layer which is ductile even after the heat treatment and which serves, in conjunction with a suitable semiconductor hard solder, for further contacting the semiconductor material, particularly in the production of variable-load-resistant semiconductor devices to be used under extreme operating conditions.

By suitable semiconductor hard solder is meant a solder not becoming plastic but remaining elastic, even at stress of the contact electrodes under thermal cycling. Preferred are eutectic gold-tin solder (80% gold/20% tin), gold-germanium solder 88/12, and gold-silicon solder 94/6.

By means of such solders the semiconductor body being provided with contact electrodes according to the proceeding of the invention is connected with metallic components serving as current conductors and often representing at the same time parts of the semiconductor casing. In such way semiconductor components with large-area current-conducting connections are obtained as, e.g., semiconductor rectifiers, power transistors or controlled rectifiers.

The examples which follow are merely illustrative embodiments which in no way limit the scope of the invention. Numerous variations, well within the contemplation of the disclosure, will be readily apparent to those skilled in the art. For a first working example of the invention a $p^+nn^+$ structure is formed by diffusion according to known methods in prepared semiconductor bodies being e.g., slightly n-conducting and having an area of at least 0.05 sq. inch., in order to obtain semiconductor rectifying components.

Subsequent to the doping the prepared semiconductor bodies are heated up to 200°–300° C in a suitable apparatus in order to improve the connection of the first contacting metal with the semiconducting material, and aluminum of approximately $3\mu$ and silver as second ductile contacting metal of approximately $15\mu$ are consecutively vapor-deposited.

In order to form an alloy between the adjacent materials of each contact electrode, the semiconductor bodies being provided on both sides with contact electrodes are heated up to approximately 650°C in a furnace under vacuum of more than $10^{-2}$ torr and are normally cooled after having achieved said temperature. In this way where is achieved a layer-construction as illustrated in FIG. 2. The soldering contact layer 6 consisting of precious metal is omitted when silver is used as second contacting metal.

For a second working example a similar procedure is followed for vapor-deposition of aluminum as the first contacting metal, palladium, as second contacting metal, is vapor-deposited on aluminum up to a thickness of approximately $5\mu$. In a further process the palladium layer is amplified up to approximately $20\mu$ through galvanic precipitation. The formation of an alloy is effected by heating up to approximately 700°C in a protective-gas atmosphere (a nitrogen current is conducted through the furnace over the components to be treated until the alloy has been achieved and the components are totally cooled off).

After the production of contact electrodes the contactable semiconductor are soldered areally at one side to a metallic casing element serving simultaneously as current conductor and at the other side to a flexible current conductor by means of an eutectic gold-tin-solder or gold-germanium-solder or gold-silicon-solder using, preferably, non-oxidizing gas as protective gas.

It will be understood that the above description of the present invention is susceptible to various modifications, changes and adaptations.

We claim:

1. A process for the preparation of a contact electrode for semiconductor devices, comprising the steps of forming a layered structure of a layer of a first contacting metal physically contacting a semiconductor surface and a layer of a ductile second contacting metal physically contacting the surface of the layer of the first contacting metal opposite that physically contacting the semiconductor surface, the first contacting metal being one which forms an alloy with the semiconductor, and subjecting said layered structure to a heat treatment during which liquid phases are simultaneously maintained at the border area between the semiconductor and the first contacting metal layer and at the border area between the first contacting metal layer and the second contacting metal layer, the thickness of the layer of the second contacting metal and the conditions of the heat treatment being chosen for retaining the ductility of a predominant portion of the second contacting metal layer, and the temperature of said heat treatment being below the eutectic temperature of the combination of semiconductor and second contacting metal but above the eutectic temperature of the two contacting metals and the combination of semiconductor and first contacting metal.

2. A process according to claim 1 wherein the first contacting metal is aluminum, the second contacting metal is silver and the temperature of the heat treatment is at a temperature within the range of from 600° to 700° C.

3. A process for the preparation of a contact electrode for semiconductor devices according to claim 1 wherein: (a) said layer of first contacting metal is applied to said semiconductor surface, and (b) said layer of ductile second contacting metal is applied to the surface of the layer of the first contacting metal opposite that applied to the semiconductor surface.

4. A process according to claim 3 wherein at least one of the contacting metals is applied by vapor deposition.

5. A process according to claim 4 wherein the contacting metals are applied by consecutive vapor deposition under high vacuum.

6. A process according to claim 3 wherein at least one of the contacting metals is applied by precipitation.

7. A process according to claim 3 wherein at least one of the contacting metals is applied by cathode sputtering.

8. A process according to claim 3 wherein the ductile second contacting metal is applied in a plurality of layers.

9. A process according to claim 8 wherein at least one layer of the first contacting metal is interposed between two successive layers of a second contacting metal.

10. A process according to claim 3 wherein the semiconductor is at a temperature of from 200° to 300° C when the layer of the first contacting metal is applied thereto, whereby the adhesion between said layer and said conductor is increased.

11. A process according to claim 3 wherein the heat treatment is effected in a protective-gas atmosphere.

12. A process according to claim 3 wherein the heat treatment is effected in a vacuum.

* * * * *